(12) United States Patent
Thirunavukarasu et al.

(10) Patent No.: US 7,944,285 B1
(45) Date of Patent: May 17, 2011

(54) METHOD AND APPARATUS TO DETECT MANUFACTURING FAULTS IN POWER SWITCHES

(75) Inventors: Senthil Arasu Thirunavukarasu, Bangalore (IN); Bambuda Chen Chien Leung, San Francisco, CA (US); Shaleen Bhabu, New Delhi (IN); Vivek Chickermane, Ithaca, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 442 days.

(21) Appl. No.: 12/100,197

(22) Filed: Apr. 9, 2008

(51) Int. Cl.
*G05F 1/10* (2006.01)

(52) U.S. Cl. .......................................... 327/544; 326/33

(58) Field of Classification Search .................. 327/544; 326/33, 34
See application file for complete search history.

(56) References Cited

U.S. PATENT DOCUMENTS

| | | | |
|---|---|---|---|
| 5,892,381 A * | 4/1999 | Koifman et al. | 327/198 |
| 6,320,418 B1 * | 11/2001 | Fujii et al. | 326/93 |
| 6,434,076 B1 * | 8/2002 | Andersen et al. | 365/222 |
| 6,593,845 B1 * | 7/2003 | Friedman et al. | 340/10.33 |
| 6,771,118 B2 * | 8/2004 | Bittlestone et al. | 327/544 |
| 6,779,163 B2 | 8/2004 | Bednar et al. | |
| 6,820,240 B2 | 11/2004 | Bednar et al. | |
| 6,883,152 B2 | 4/2005 | Bednar et al. | |
| 7,126,370 B2 * | 10/2006 | Bhattacharya | 326/33 |
| 7,134,028 B2 * | 11/2006 | Bose et al. | 713/300 |
| 7,222,244 B2 * | 5/2007 | Kawahara et al. | 713/300 |
| 7,277,803 B2 * | 10/2007 | Thirunavukarasu et al. | 702/57 |
| 7,428,675 B2 * | 9/2008 | Gattiker et al. | 714/726 |
| 7,550,987 B2 * | 6/2009 | Acharyya et al. | 324/763 |
| 7,675,308 B1 * | 3/2010 | Chen et al. | 324/763 |
| 2002/0112193 A1 * | 8/2002 | Altman et al. | 713/323 |
| 2005/0068059 A1 * | 3/2005 | Takahashi et al. | 326/16 |
| 2005/0289368 A1 * | 12/2005 | Chang et al. | 713/300 |
| 2010/0231252 A1 * | 9/2010 | Goel et al. | 324/765 |

* cited by examiner

*Primary Examiner* — Thomas J Hiltunen
(74) *Attorney, Agent, or Firm* — Schwegman, Lundberg & Woessner, P.A.

(57) ABSTRACT

An integrated circuit is provided that comprises a power switch that includes a control terminal and that is coupled between a power source node and a power sink node; first data storage circuit includes a data storage input and a data storage output, wherein the data storage output is coupled to the power switch control terminal; and a second data storage circuit includes a data storage input and a data storage output, wherein the data storage input is coupled to the power sink node.

10 Claims, 5 Drawing Sheets

METHOD AND APPARATUS TO DETECT MANUFACTURING FAULTS IN POWER SWITCHES

BACKGROUND OF THE INVENTION

1. Field of the Invention

The invention relates in general to testing of integrated circuits, and more particularly, to testing of power gating circuitry.

2. Description of the Related Art

There is a growing need for enhanced power management capability in electronic devices, especially in battery-operated portable wireless devices such as cell phones, for example. Power management typically involves minimizing overall power consumption among different device functions. For applications such as cell phones that typically have long shut-down periods, power consumption typically is dominated by leakage power consumption while the device is turned off. Power gating is a technique that addresses this problem by shutting off power to circuit blocks that are not in use.

FIG. 1 is an illustrative circuit diagram of a portion of an integrated circuit 100 including typical power gating circuitry 102, 104. A first power switch transistor 102 sometimes referred to as a 'header' power switch, controllably couples the circuit block 106 to a VDD power supply rail 108. A second power switch transistor 104 sometimes referred to as a 'footer' power switch, controllably couples the circuit block 106 to a VSS effective ground potential rail 110. The circuit block 106, for example, may comprise combinational logic circuitry such as a CPU or DSP core, a memory and memory management unit. During operational mode, first (header) power switch transistor 102 is turned ON so as to close the switch and couple the circuit block 106 to the VDD power supply rail 108, and second (footer) power switch transistor 104 is turned ON so as to close the switch and couple the circuit block 106 to the VSS ground potential rail 110. During a sleep mode, first power switch transistor 102 is turned OFF to open the switch and decouple the circuit block 106 from the VDD power supply rail, and second power switch 104 is turned OFF so as open the switch and decouple the circuit block from the VSS ground potential rail 110.

FIG. 2 is a more detailed illustrative drawing of known header power gating circuitry 200 including the header power switch transistor 102 of FIG. 1 and a first storage circuit 202 to store a control signal to control on/off switching state of the power switch 102. In the embodiment of FIG. 2, the power switch is 102 comprises a PMOS transistor, and the storage circuitry comprises a state element like a flip-flop circuit to hold the switch value. A gate terminal 204 of the PMOS transistor 102 serves as the power switch's control terminal 204. A first bias terminal 206, which is a drain terminal in the example PMOS transistor, is coupled power source node 208. A second bias terminal, which is a second biasterminal 210 in the example PMOS transistor is coupled to a power sink node 212. More particularly, the first bias terminal 206 is coupled to the VDD power supply rail 214, and the power source node 208 represents an arbitrary location along a conductive path between the power supply rail 214 and the first bias terminal 206. The second bias terminal 210 is coupled to switched power supply terminal(s) VDDC of a gated circuit block (not shown) that is, i.e. a block that is switched on/off by the power switch 102. The power sink node 212 represents an arbitrary location along a conductive path between the second bias terminal 210 and the switched power supply terminal(s) VDDC. When the switch 102 is closed, power is 'sourced' from the VDD power to the switch and 'sinked' from the switch 102 to the switched power supply terminal(s) VDDC of the circuit block in order to power-up the circuitry within the block.

The storage circuit 202 has an unswitched connection to the VDD power supply. In operation, when the switched power supply VDDC is to be powered-up through VDD, a logical '0' is latched in the flip-flop 202, and the PMOS power switch 102 is turned ON, i.e. the switch 102 is closed, and a path from the first bias terminal 206 to the second bias terminal 210 is established. When the switched power supply VDDC is to be cutoff from the VDD, a logical '1' is latched in the flip-flop 202, and the PMOS switch 102 is turned OFF, i.e. the switch 102 is opened, and a path between VDD and VDDC is cutoff.

As explained with reference to FIG. 1, power gating circuitry ordinarily operates by selectively isolating the gated logic from both the power supply and from ground potential. Accordingly, footer power gating circuitry (not shown) typically is provided that basically has the same circuit topology as the header power gating circuitry 200 of FIG. 2. The operation of such footer power gating circuitry will be readily appreciated by persons of ordinary skill in the art from the above description of the operation of the header power gating circuitry 200. Alternatively, the header power switch can be an NMOS transistor and the footer power switch can include a PMOS transistor.

FIG. 3 is an illustrative drawing of the known power gating circuitry 200 of FIG. 2 that exhibits an 'always-ON' defect, which is represented by dashed lines 302 between the first and second terminals 206, 210. Unfortunately, manufacturing defects are not uncommon occurrences in the production of integrated circuit devices. One type of defect causes a switch, such as illustrative switch power switch 102, to be always in turned-ON state. The dashed lines 302 represent a manufacturing defect that causes the power switch to be always-ON in that there is a permanent connection between the first and second terminals 206, 210, and therefore, between the source and sink nodes 208, 212, and also between the supply voltage VDD and the switched supply VDDC. In other words, due to a manufacturing defect the first bias terminal 206 and the second bias terminal 210 of the PMOS transistor 102 are shorted together, and as a result the logical state of a control signal applied to the gate terminal 204 cannot be used to turn-OFF the switch 102. Because of this always-ON behavior, current may be drawn from the power supply VDD by a circuitry (not shown) that is intended to be turned off and when in a sleep mode, thus decreasing the battery life if the device is a battery operated device. Moreover, if the package for such integrated circuit device is not designed to handle such always-ON activity then, due to the fault in the power switch there could be over-heating of the device that could lead to meltdown and device failure in the field. Hence, the condition of the power switch being always ON can be a critical fault that should be detected during the manufacturing test.

Moreover, the illustrative power switch 102 also is susceptible to manufacturing defects causing the switch to be always-OFF. Over time, such always-OFF defect in a power switch can eventually lead to an accumulation of charge, causing the switch 102 to convert to always-ON behavior resulting in the power drain and overheating problems described above, for example.

Unfortunately, defects in power switch circuitry are so called 'soft' defects that do not ordinarily show up as a failure during testing, but nevertheless, can prevent a device from entering into a deep sleep or power saving mode, leading to shorter battery life and reduced quality of the device. Specifically, we refer to these as soft defects because unlike a 'hard' manufacturing defects that would cause incorrect operation of the circuit during normal powered-up operation and hence rendering the chip useless, a defect in the power switch part of a circuit will not render the device useless because it does not affect the functionality during normal operation. Nevertheless, this is a defect because, a circuit that is supposed to be sleeping and saving power so as to extend battery life would be active and dissipating power, which could lead to shorter battery life and hence not meeting the stated power saving device specifications. Unfortunately, the above-described type of defect is not detected by typical ATPG and functional tests.

Thus, there has been a need to detect manufacturing defects in power switch circuitry. The present invention meets this need.

SUMMARY OF THE INVENTION

One aspect of the invention provides an integrated that includes a power switch that includes a control terminal. The power switch is coupled between a power source node and a power sink node. A first data storage circuit includes a data storage input and a data storage output, and its data storage output is coupled to the power switch control terminal. A second data storage circuit includes a data storage input and a data storage output, and the data storage input is coupled to the power sink node. The first storage element can be used to determine the desired ON/OFF state of the power switch both during functional and test mode operation. The second storage element can be used to capture a signal indicative of actual ON/OFF state of the power switch during test mode operation.

Another aspect of the invention involves a method of manufacturing testing of a power transistor in an integrated circuit. The power transistor includes a first bias terminal coupled a source power supply line and includes a second bias terminal coupled to a switched power supply line. The testing method involves applying a source power supply to the source power supply line. A control signal is provided to a control terminal of the power transistor that should turn off the power transistor. A voltage level on the second bias terminal responsive to the control signal that is indicative of the state of the switch transistor is captured for evaluation.

BRIEF DESCRIPTION OF THE DRAWINGS

The aforementioned features and advantages of the invention, as well as additional features and advantages thereof, will be more clearly understandable after reading detailed descriptions of embodiments of the invention in conjunction with the following drawings.

DETAILED DESCRIPTION OF THE PREFERRED EMBODIMENTS

The following description is presented to enable any person skilled in the art to make and use a method and apparatus to detect manufacturing faults in power switches, in accordance with embodiments of the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and processes are shown in block diagram form in order not to obscure the description of the invention with unnecessary detail. Thus, the present invention is not intended to be limited to the embodiments shown, but is to be accorded the widest scope consistent with the principles and features disclosed herein.

Figure 1:
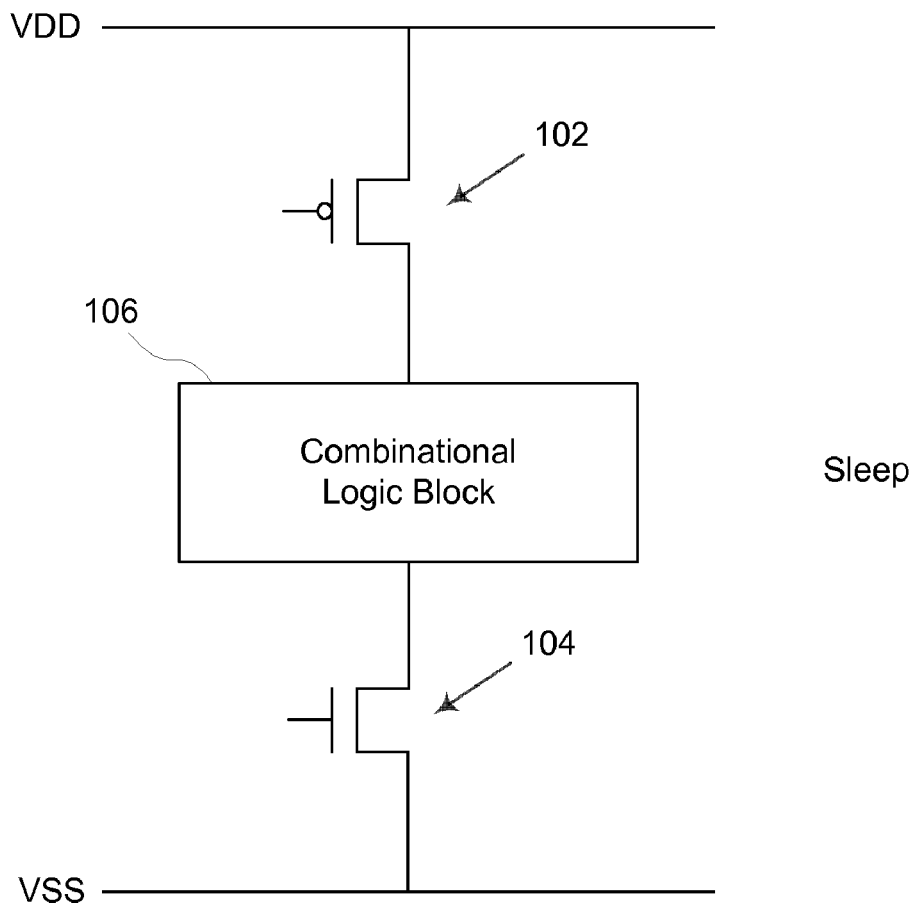
FIG. 1 is an illustrative circuit diagram of a portion of an integrated circuit including known power gating circuitry.
Figure 2:
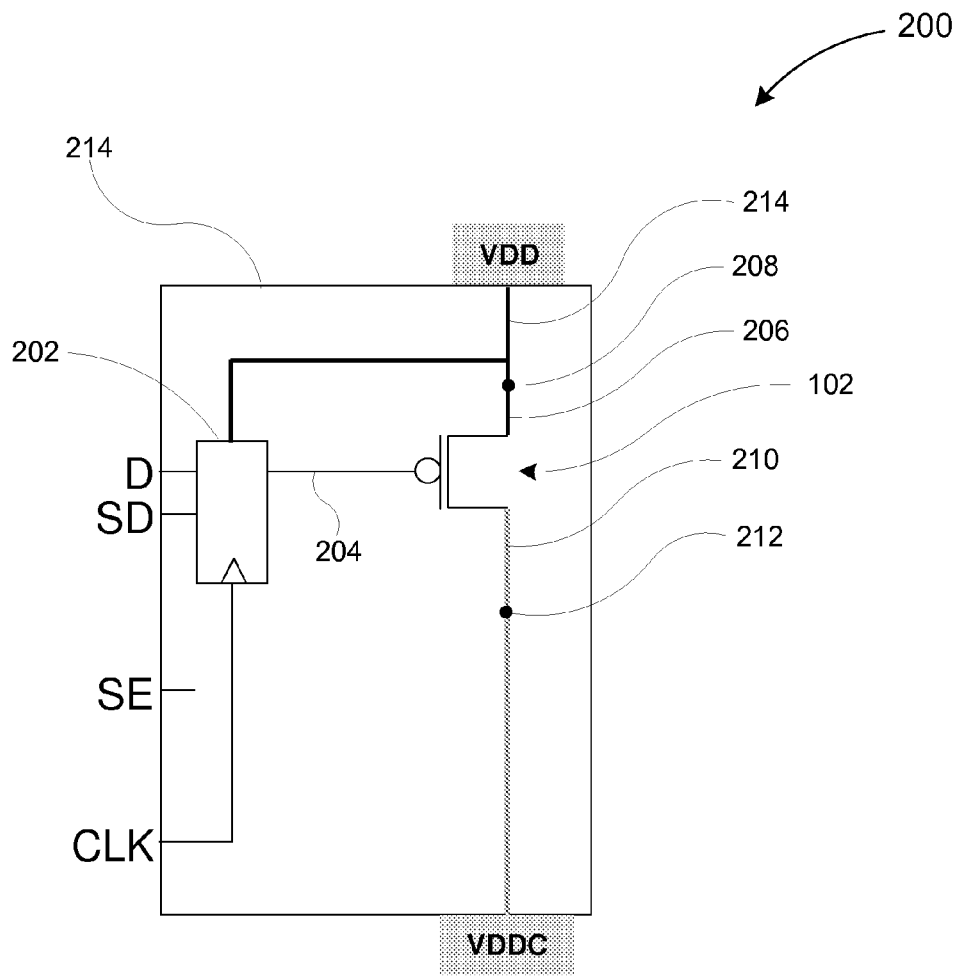
FIG. 2 is a more detailed illustrative drawing of known power gating circuitry including the header power switch transistor of FIG. 1 and a first storage circuit to store a control signal to control on/off switching state of the switch.
Figure 3:
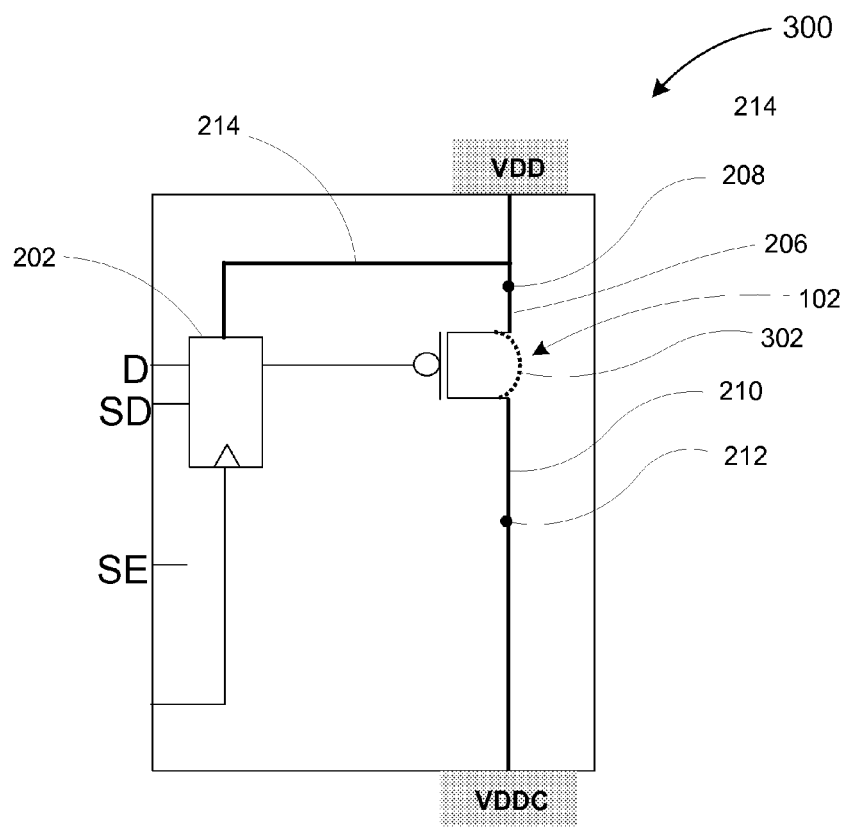
FIG. 3 is an illustrative drawing of the known power gating circuitry of FIG. 2 that exhibits an always-ON defect.
Figure 4:
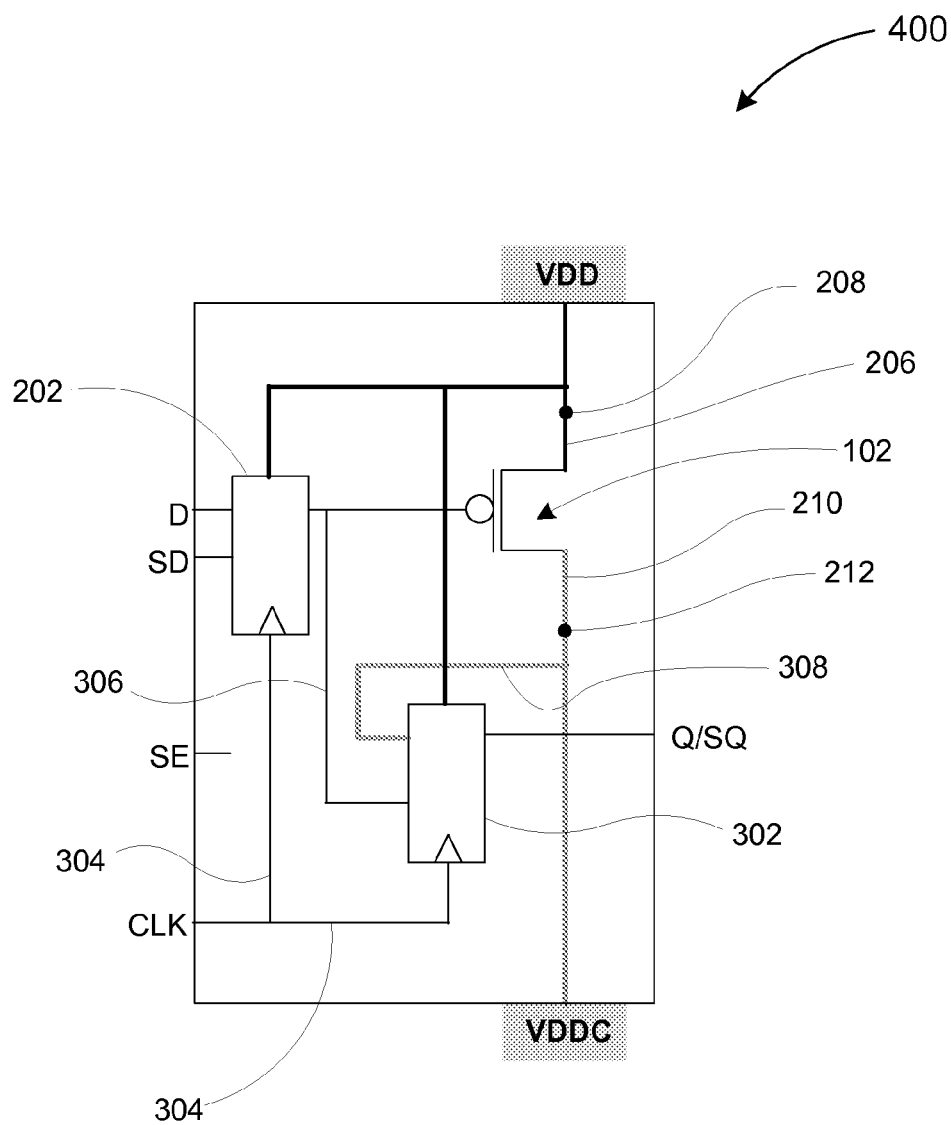
FIG. 4 is an illustrative circuit diagram showing power gate circuitry including a storage circuit useful for manufacturing testing in accordance with some embodiments of the invention.

FIG. 4 is an illustrative circuit diagram showing power gating and test circuitry 400 in accordance with some embodiments of the invention. Components of the embodiment of FIG. 4 that are identical to corresponding components described with reference to other drawings are labeled with the same reference numerals that are used in the in the other drawings. In the interest of efficiency of disclosure, details of these identical components and their operation that have been described above are not repeated in full again.

The power gating and test circuitry 400 is coupled to serve as a header power gating circuitry which includes a header power switch 102, a first storage circuit 202 and a second storage circuit 302, which are powered by the unswitched supply voltage VDD rail. The first storage circuit 202 is used to store a control signal used to control the on/off state of the switch 102. The second storage circuit 302 is used during manufacturing testing to test for possible defects in the power switch 102. The first and second storage circuits 202, 302 are coupled in a scan test chain as explained more fully below.

More specifically, the PMOS power switch transistor 102 includes a gate 204, a first bias terminal 206 (e.g. drain) and a second bias terminal 210 (e.g. source). A power source node 208 is disposed at an arbitrary location between the first bias terminal 206 and the VDD power supply line. A power sink node is disposed at an arbitrary location between the second bias terminal 210 and the switched supply VDDC line, which is coupled to the power supply terminal(s) of power gated circuitry (not shown) controlled by the power switch 102.

The voltage level at the switched supply voltage VDDC is controlled by the state of the power switch transistor 102. During normal (defect-less) operation, when the power switch 102 is turned-ON and the switch 102 is closed, the switched power supply VDDC is essentially at the supply voltage level VDD, and the power gated circuitry (not shown) is powered-ON. Conversely, when the power switch 102 is turned-OFF and the switch 102 is open, the switched power supply VDDC is effectively at zero, and the power-gated circuitry (not shown) is powered-OFF.

The first data storage circuit 202, which comprises a first D-type flip-flop circuit, includes a data input D and a scan data input SD. The first data storage element 202 also includes a Q/SQ (data/scan data) output and a clock signal input. The first data storage element output is coupled to the power switch gate 204, which serves as a control terminal for the switch 102. The first data storage element 202 includes clock signal input is coupled to clock line 304.

The second data storage circuit 302, which comprises a second D-type flip-flop circuit, includes a data storage input D and a scan data input SD. The scan data input SD of the second storage circuit 302 is coupled via line 306 to the output of the first storage circuit 202. The data input D of the second storage circuit 302 is coupled via line 308 to the second bias terminal 210 of the power switch 102. The second data storage element 302 also includes a Q/SQ (data/scan data) that may be coupled to a additional scan chain circuitry (not shown). The second data storage element clock signal input is coupled to clock line 304.

The first and second storage elements 202, 306, which comprise scan flip-flops, are a part of a longer scan chain (not shown) that is used to scan in values to test the circuit for manufacturing defects, for example. A values scanned in to the first scan flip flop 202 is used to set the state of the power transistor 102 during testing. The second scan flip flop 302 is used to capture a power state signal indicative of the power on the sink node 212. The sink node serves as an observable point in the power gating circuitry 400. The captured power state value can be observed for later evaluation by shifting it out through the scan chain. In accordance with some embodiments, the second storage flip-flop 302 serves as a test point insertion flip-flop that is used to capture the state of the power switch transistor 102. In order to test for an always-ON defect, a voltage level is tested at the second bias terminal 210 (sink node 212) of the switch transistor 102 while the switch is provided with a control signal that should cause it to be in an OFF state. If the voltage level at the second bias terminal is at the VDD supply voltage level, indicating that the switch is in an ON state, then the switch 102 is determined to have an always-ON defect.

More particularly, during a scan-in stage of a manufacturing test process, in order to test whether the switch 102 has an always-ON defect, a logical value '1' is scanned in to both the first and second storage circuits 202, 302 during scan chain initialization. The logical 1 value in the first storage circuit 202 causes an occurrence of a logical 1 value on the control gate 204 of the switch 102. If the switch 102 is operating correctly, then the provision of the logical 1 on the control gate 204 will cause the switch 102 to turn OFF, isolating the second bias terminal 210 (and the sink node 212) of the switch from the VDD power supply rail. During a capture stage of the manufacturing test process, the second storage circuit 302 inputs as a data signal on line 308 that is indicative of a voltage level on the second bias terminal 210 (the sink node 212).

In some embodiments, a VDD supply voltage level on the second bias terminal corresponds to a logical 1 level signal, and an effective ground level signal corresponds to a logical 0 level signal. Thus, if the switch 102 does not have an always-ON defect then a logical 1 input to the control terminal will turn-OFF the switch, and the second storage element 302 will capture and store a logical 0 value. If on the other hand, the switch 102 does have an always-ON defect then the switch 102 will not turn-OFF in response to the logical 1 input to its control terminal 204, and the second storage element 302 will capture and store a logical 1 value. The captured value can be output by the second storage circuit 302 and for use in evaluating whether the switch 102 has an always-ON defect. In essence, the described process involves a 'stuck-at' fault test, in which a determination is made as to whether the switch 102 is stuck-at the ON state. The test can be performed as part of a general stuck-at test performed after completion of a scan chain integrity test, which ensures the first and second storage circuits 202, 302 themselves have no problem in retaining the programmed values.

It will be appreciated that although the above description is provided for power gating circuitry coupled to serve as header power gating, the same basic topology can be used to serve as footer power gating circuitry (not shown).

A typical integrated circuit power system that powers the circuit ordinarily includes a power grid that having multiple taps of the VDD power supply from the chip periphery to the functional circuitry inside. These taps to the internal functional logic branch to different parts of the circuit in a grid fashion. In order to gate power to a domain or a portion of the overall circuit multiple gating power switches are used to gate power to the various the power tap points.

Figure 5:
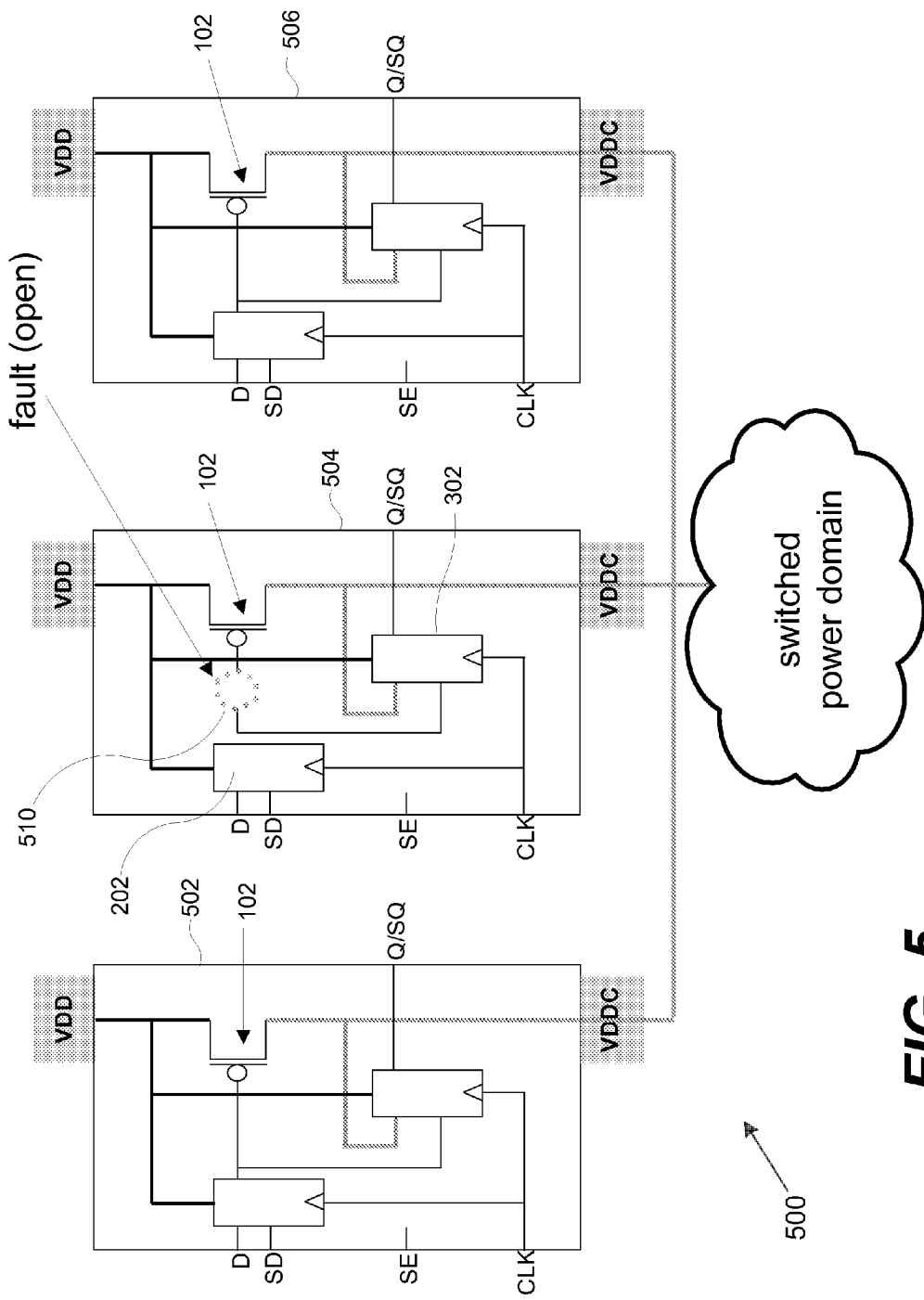
FIG. 5 is an illustrative drawing showing a portion of an integrated circuit multiple header power switches each identical to that of FIG. 4 coupled to provide switched power supply VDDC to a switched power supply domain in accordance with some embodiments of the invention.

FIG. 5 is an illustrative drawing showing a portion of an integrated circuit 500 multiple header power gating circuits 502, 504, 506, each identical to that of FIG. 4 coupled to provide switched power supply VDDC to a gated (or switched) power supply domain 508 in accordance with some embodiments of the invention. Consider detection of an always-ON defect in a circuit that includes multiple header power gating circuits. One approach to detecting an always-ON state is to provide respective turn-OFF control signals to the respective power switch transistors 102 of the each of the three power gating circuits 502-506. Assuming that any respective one or more of the power switch transistors 102 of the three illustrated header power gating 502-506 has an always-ON defect, then the switched power voltage level VDDC at the respective sink nodes of each of the three power gating circuits 502-506 will be at the VDD supply level. Thus, if any one of the three power gating circuits has an always-ON defect, then the power at the sink nodes of all three will be the opposite of what it should be, and an always-ON defect will be apparent from the state detected at the sink nodes of any of the three power gating circuits 502-506. If on the other hand, none of the three power switch transistors 102 of the three illustrated power gating circuits 502-506 has an always-ON defect, then the switched power voltage level VDDC at the respective sink nodes of each of the three power gating circuits 502-506 will be at the effective ground level. Thus, if any one of the three detects an ON state, when the power switches should be turned-OFF, then an always-ON defect is detected.

The foregoing description and drawings of preferred embodiments in accordance with the present invention are merely illustrative of the principles of the invention. Various modifications can be made to the embodiments by those skilled in the art without departing from the spirit and scope of the invention, which is defined in the appended claims.

The invention claimed is:

1. An integrated circuit comprising:
   a power switch that includes a control terminal and that is coupled between a power source node and a power sink node;
   a first data storage circuit that includes a first scan element that includes a first data input and a first scan data input and a first data/scan data output, wherein the first data/scan data output is coupled to the power switch control terminal; and
   a second data storage circuit that includes a second scan element that includes a second data input and a second scan data input and a second data/scan data output, wherein the second data input is coupled to the power sink node;

wherein first scan element and the second scan element are coupled in a scan chain in which the first data/scan data output is coupled to the second scan data input.

2. The integrated circuit of claim 1 further including:
an unswitched power supply line;
a switched power supply line;
wherein the power source node is coupled to the unswitched power supply line;
wherein the power sink node is coupled to the switched power supply line;
wherein the first data storage circuit includes a power supply terminal coupled to the unswitched power supply line; and
wherein the second data storage circuit includes a power supply terminal coupled to the unswitched power supply line.

3. The integrated circuit of claim 1 further including:
an unswitched power supply line;
a switched power supply line;
wherein the power source node is coupled to the unswitched power supply line;
wherein the power sink node is coupled to the switched power supply line;
wherein the first data storage element includes a power supply terminal coupled to the unswitched power supply line; and
the second storage element is includes a power supply terminal coupled to the unswitched power supply line.

4. An integrated circuit of claim 1 further including:
an unswitched power supply line;
a switched power supply line;
wherein the power source node is coupled to the unswitched power supply line;
wherein the power sink node is coupled to the switched power supply line;
wherein the first scan element comprises a first D-type flip-flop that includes a power supply terminal coupled to the unswitched power supply line;
wherein the second scan element comprises a second D-type flip-flop that includes a power supply terminal coupled to the unswitched power supply line; and
wherein the first D-type flip-flop includes a first data/scan data output terminal coupled to a scan data input terminal of the second D-type flip-flop.

5. An integrated circuit comprising:
an unswitched power supply line;
a switched power supply line;
a header power switch that includes a control terminal and that is coupled between a power source node and a power sink node;
wherein the header power source node is coupled to the unswitched power supply line;
wherein the header power sink node is coupled to the switched power supply line;
a first header scan element coupled to receive power from the unswitched power supply and that includes a first data input and a first scan data input and a first data/scan data output, wherein the first data/scan data output is coupled to the header power switch control terminal; and
a second header scan element coupled to receive power from the unswitched power supply and that includes a second data input and a second scan data input and a second data/scan data output, wherein the second data input is coupled to the header power sink node;
wherein first scan element and the second scan element are coupled in a scan chain in which the first data/scan data output is coupled to the second scan data input.

6. The integrated circuit of claim 5,
wherein the first header scan element includes a first D-type flip-flop; and
wherein the second header scan element includes a second D-type flip-flop.

7. A method of manufacturing testing of a power transistor in an integrated circuit that includes a control terminal and that is coupled between an unswitched power supply line and a switched power supply line, the method comprising:
scanning in a control signal to a first scan element coupled to receive power from the unswitched power supply line, wherein the first scan element includes a first data input and a first scan data input and a first data/scan data output, wherein the first data/scan data output is coupled to the control terminal, and wherein the scanned in control signal is scanned in to the first scan data input and causes the power transistor to turn-off when applied to the control terminal;
scanning in the control signal from the first scan element to a second scan element that is coupled to receive power from the unswitched power supply line, wherein the second scan element includes a second data input and a second scan data input and a second data/scan data output, and wherein first scan element and the second scan element are coupled in a scan chain in which the first data/scan data output is coupled to the second scan data input
applying the scanned in control signal over the first data/scan data output from the first scan element to the control terminal; and
capturing a signal from the switched power supply line over the second scan data input into the second scan element, when the scanned in control signal is applied to the control terminal.

8. The integrated circuit of claim 7,
wherein the first header scan element includes a first D-type flip-flop; and
wherein the second header scan element includes a second D-type flip-flop.

9. A method of manufacturing testing of a power transistor in an integrated circuit that includes a first bias terminal coupled a source power supply line and that includes a second bias terminal coupled to a switched power supply line, the method comprising:
applying a source power supply to the source power supply line;
providing a control signal to a control terminal of the power transistor that should turn off the power transistor; and
capturing a signal from the second bias terminal of the switch transistor that is indicative of the state of the switch transistor;
shifting the control signal through a scan chain to a first scan element that is coupled to provide the control signal to the control terminal of the power transistor;
shifting the captured value through the scan chain for evaluation;
wherein capturing includes storing in a second scan element, a value indicative of the power switch transistor state.

10. The method of claim 9,
wherein the first header scan element includes a first D-type flip-flop; and
wherein the second header scan element includes a second D-type flip-flop.

* * * * *

UNITED STATES PATENT AND TRADEMARK OFFICE
CERTIFICATE OF CORRECTION

Page 1 of 1

PATENT NO.         : 7,944,285 B1
APPLICATION NO.    : 12/100197
DATED              : May 17, 2011
INVENTOR(S)        : Senthil A. Thirunavukarasu et al.

It is certified that error appears in the above-identified patent and that said Letters Patent is hereby corrected as shown below:

In column 1, line 55, delete "biasterminal" and insert -- bias terminal --, therefor.

In column 7, line 27, in Claim 3, delete "is includes" and insert -- includes --, therefor.

In column 7, line 29, in Claim 4, delete "An" and insert -- The --, therefor.

Signed and Sealed this
Twelfth Day of July, 2011

David J. Kappos
*Director of the United States Patent and Trademark Office*